United States Patent [19]
Hoffman

[11] Patent Number: 5,805,427
[45] Date of Patent: Sep. 8, 1998

[54] BALL GRID ARRAY ELECTRONIC PACKAGE STANDOFF DESIGN

[75] Inventor: Paul R. Hoffman, Modesto, Calif.

[73] Assignee: Olin Corporation, Manteca, Calif.

[21] Appl. No.: 601,415

[22] Filed: Feb. 14, 1996

[51] Int. Cl.[6] .............................. H05K 1/18; H05K 3/34
[52] U.S. Cl. .................. 361/770; 361/761; 361/764; 361/772; 361/809; 257/704; 257/737; 257/738; 257/780; 257/786; 438/122; 438/124; 438/613; 228/180.22
[58] Field of Search ........................... 361/761–764, 361/770, 772, 774, 783, 807, 809, 820; 174/52.4; 228/180.22; 437/183, 208, 209, 221, 915; 257/675, 697, 704, 706, 737, 738, 778, 779, 780, 786; 438/121, 122, 124, 125, 126, 613, 616

[56] References Cited

U.S. PATENT DOCUMENTS

| | | | |
|---|---|---|---|
| 3,893,156 | 7/1975 | Riseman | 257/738 |
| 4,577,398 | 3/1986 | Sliwa et al. | 257/779 |
| 4,703,339 | 10/1987 | Matsuo | 257/706 |
| 4,731,644 | 3/1988 | Neidig | 257/704 |
| 4,784,974 | 11/1988 | Butt | 438/123 |
| 4,816,896 | 3/1989 | Owens | 257/798 |
| 4,888,449 | 12/1989 | Crane et al. | 174/52.4 |
| 4,939,316 | 7/1990 | Mahulikar et al. | 174/52.4 |
| 5,045,921 | 9/1991 | Lin et al. | 257/780 |
| 5,083,191 | 1/1992 | Ueda | 257/783 |
| 5,092,034 | 3/1992 | Altendorf et al. | 29/840 |
| 5,102,829 | 4/1992 | Cohn | 438/118 |
| 5,220,200 | 6/1993 | Blanton | 257/778 |
| 5,222,014 | 6/1993 | Lin | 228/180.22 |
| 5,283,446 | 2/1994 | Tanisawa | 257/737 |
| 5,293,072 | 3/1994 | Tsuji et al. | 257/737 |
| 5,376,588 | 12/1994 | Pendse | 257/666 |
| 5,394,009 | 2/1995 | Loo | 257/666 |
| 5,394,490 | 2/1995 | Kato et al. | 257/778 |
| 5,403,776 | 4/1995 | Tsuji et al. | 257/738 |
| 5,446,316 | 8/1995 | Temple et al. | 257/704 |
| 5,541,450 | 7/1996 | Jones et al. | 257/697 |
| 5,583,377 | 12/1996 | Higgins, III | 257/706 |
| 5,629,835 | 5/1997 | Mahulikar et al. | 361/761 |
| 5,650,918 | 7/1997 | Suzuki | 361/764 |

FOREIGN PATENT DOCUMENTS

| | | | |
|---|---|---|---|
| 60-160147 A | 8/1985 | Japan | 257/691 |
| 60-263451 A | 12/1985 | Japan | 257/697 |
| 60-263452 A | 12/1985 | Japan | 257/697 |
| 3-91257 A | 4/1991 | Japan | 257/706 |
| 4-245459 A | 9/1992 | Japan | 257/706 |
| 5-343559 A | 12/1993 | Japan | 257/697 |

*Primary Examiner*—Leo P. Picard
*Assistant Examiner*—John B. Vigushin
*Attorney, Agent, or Firm*—Gregory S. Rosenblatt; Wiggin & Dana

[57] ABSTRACT

A surface mount package to encapsulate one or more semiconductor devices has a standoff that maintains the thickness of solder columns bonding the package to an external circuit. The standoff either extends over or circumscribes a central portion of the package base. To enhance the thermal performance of the standoff, a solderable layer enhances soldering of the standoff to the external circuit.

In alternative embodiments, the standoff contains a flange having a plurality of apertures useful for either mechanically locking an adhesive or for enabling irradiation of an adhesive by a light source. The standoff may contain protrusions for alignment, strength or circuit routing.

26 Claims, 4 Drawing Sheets

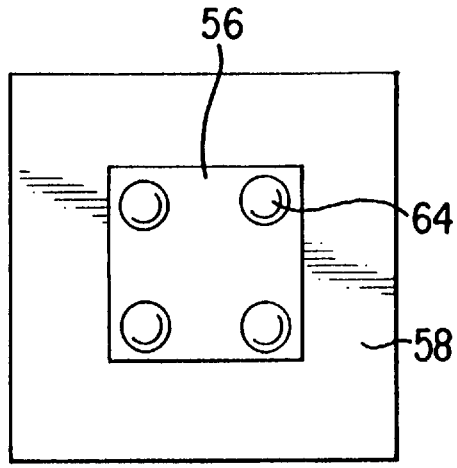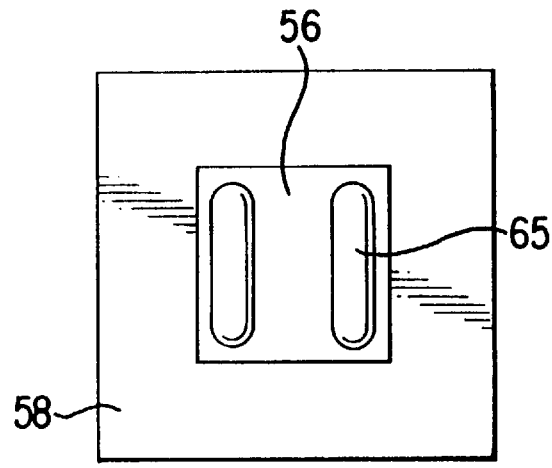
FIG. 4  FIG. 5
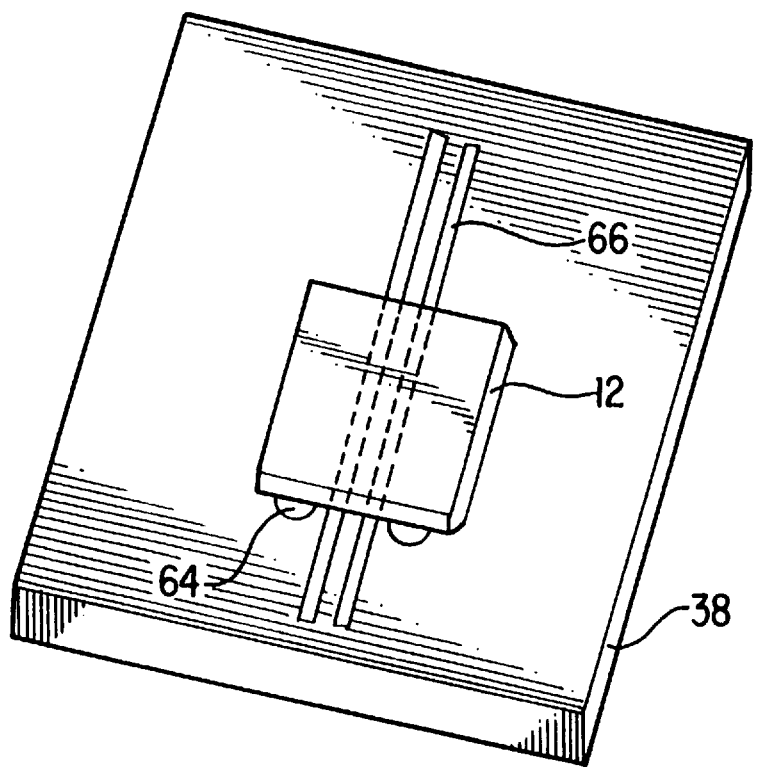
FIG. 6

BALL GRID ARRAY ELECTRONIC PACKAGE STANDOFF DESIGN

BACKGROUND OF THE INVENTION

1. Field of the Invention

This invention relates to a standoff for a ball grid array electronic package. More particularly, the amount of solder ball collapse is determined by a standoff attached to a central portion of the package base.

2. Description of Related Art

Electronic packages provide environmental and mechanical protection to an integrated circuit device. Additionally, the electronic package provides a conduit for electrical signals to travel between external circuitry and the integrated circuit device. One type of electronic package is referred to as a surface mount package. With a surface mount package, electrically conductive sites on the package body are soldered directly to bond pads on an external circuit, such as a printed circuit board. A surface mount package does not require external leads and therefore, requires less space for mounting on the external circuit. One type of surface mount package is a ball grid array electronic package.

Ball grid array electronic packages are used to house one or more integrated circuit devices, such as silicon based semiconductor chips. The ball grid array electronic packages have a base component containing a plurality of metallized circuit traces. A semiconductor device is bonded to a central portion of the base component and is electrically interconnected to one end of the circuit traces.

The opposing ends of the circuit traces form an array about a peripheral portion of the base component. Solder balls are then attached to each point of this array.

A covering encapsulates a central portion of the base component, the semiconductor device and the inner ends of the circuit traces. The solder balls then bond the ball grid array electronic package to an external structure, such as a printed circuit board.

One type of a ball grid array electronic package has a metallic base component that is typically an aluminum alloy. An anodization layer coats portions of the base component to provide electrical isolation between the circuit traces and the metallic base component. This type of ball grid array is disclosed in U.S. Pat. No. 5,629,835 by Mahulikar et al. that is incorporated by reference in its entirety herein.

When the solder balls melt and become liquid, surface tension attraction of the liquid solder to the array on the package base and to a matching array of metallized pads on a printed circuit board causes the ball grid array package to self center, facilitating alignment of the package. However, the weight of the package compresses the liquid solder prior to solidification into a solder joint.

The thinner the solder joint, once solidified, the more prone that joint is to fatigue fracture. Fatigue fracture occurs because the coefficients of thermal expansion of the electronic package base and of the external structure are different. As the package base is cyclically heated and cooled, during operation of the semiconductor device, stresses are applied to the solder joints. These stresses propagate stress cracks through the solder joints. When a stress crack extends across the diameter of the solder joint, package failure occurs.

One way to minimize fracture of the solder joints is to maintain a relatively thick solder joint following soldering. U.S. Pat. No. 5,629,835 discloses a standoff, polymer protrusions at the peripheral corners of the package base, that maintains the height of the solder joint. Other standoffs are disclosed in U.S. Pat. No. 4,816,896 to Owens and 5,045,921 to Lin et al. Both the Owens patent and the Lin et al. patent are incorporated by reference in their entireties herein. In the Owens patent, an apertured standoff is designed to fit over the corner pins of a pin grid array electronic package. In the Lin et al. patent, a centrally disposed cover component determines the height of the solder joints.

While the prior art standoffs are effective, there remains a need for a centrally disposed standoff that facilitates package assembly and alignment.

SUMMARY OF THE INVENTION

Accordingly, it is an object of the present invention to provide a standoff for a ball grid array electronic package. It is a feature of the invention that this standoff is bonded to a central portion of the package base and either encapsulates or circumscribes the central portion of the base.

In one embodiment of the invention, the standoff has a solderable first major surface and an electrically insulating second major surface. Alternatively, the standoff has a central portion and a parallel running, non-planar, peripheral flange. A plurality of apertures may extend through the flange. In another embodiment, a plurality of extensions protrude from either the central portion or from the flange.

Among the advantages of the standoffs of the invention are that the amount of solder ball squeeze-out is controlled, minimizing fatigue fracture. In some embodiments, the standoff is bonded to an external structure to reduce stresses applied to the solder balls and to provide a conduction path for enhanced thermal dissipation. In alternative embodiments, a gap is provided under a portion of the standoff to permit circuit traces to extend beneath the standoff.

In accordance with the invention, there is provided a cover for an electronic package. The cover has a substrate with a first major surface that is generally parallel to a second major surface and sidewalls that extend from the first major surface to the second major surface. A solderable layer coats a central portion of the first major surface. Optionally, an electrically insulating layer may coat a central portion of the second major surface.

In accordance with another embodiment of the invention, the cover for the electronic package has a substrate with a central portion and a parallel running, non-planar, peripheral flange. The flange may contain a plurality of apertures extending therethrough. Optionally, a plurality of extensions may protrude from either the central portion of the cover or from the flange.

The above stated objects, features and advantages will become more apparent from the specification and drawings that follow.

IN THE DRAWINGS

FIG. 4 shows in top planar view a standoff in accordance with another embodiment of the invention.

FIG. 5 shows in top planar view a standoff in accordance with another embodiment of the invention.

FIG. 6 illustrates in partial perspective view circuit traces extending under the standoff of either FIG. 4 or FIG. 5.

DETAILED DESCRIPTION

Figure 1:
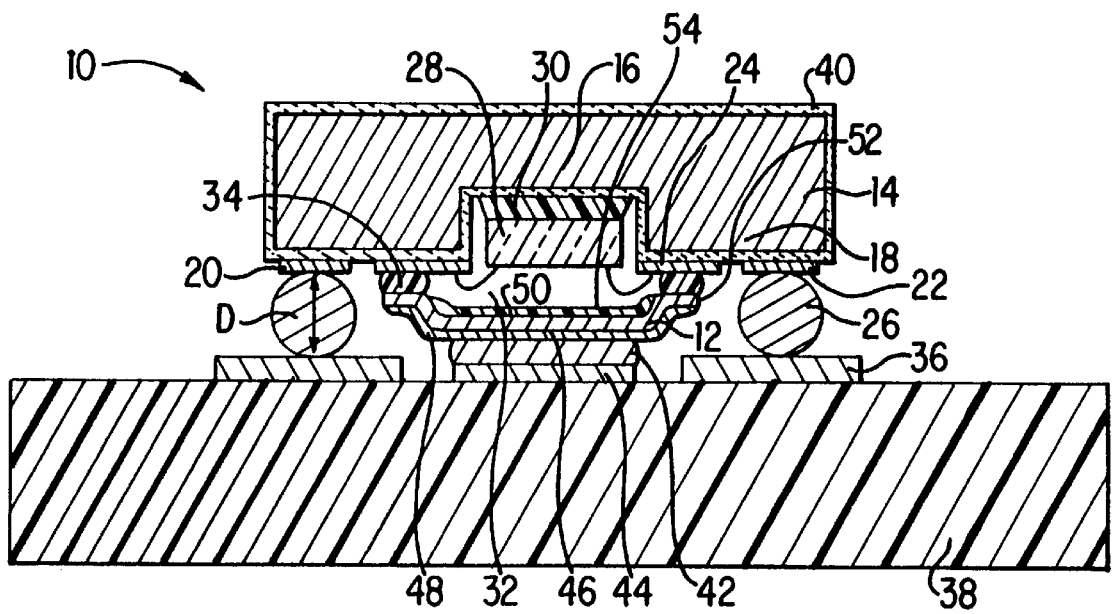
FIG. 1 shows in cross-sectional representation a ball grid array package, including a standoff in accordance with an embodiment of the invention.
Figure 2:
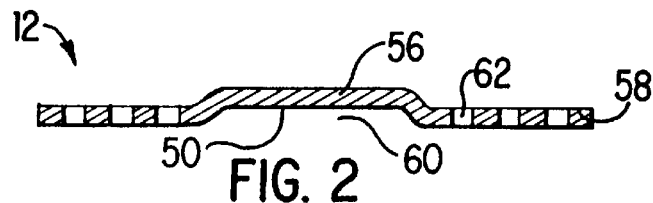
FIG. 2 illustrates in cross-sectional representation a standoff in accordance with a second embodiment of the invention.

FIG. 1 illustrates in cross-sectional representation a ball grid array electronic package 10 utilizing a standoff 12 in accordance with an embodiment of the invention. The ball grid array package 10 includes a base 14 having a central portion 16 and a peripheral portion 18. A plurality of circuit traces 20 are formed on the peripheral portion 18 of the base. Each circuit trace 20 has an external end 22 and an inner end 24. The external ends 22 of the circuit traces form an array. Solder balls 26 having a diameter "D" prior to melting are bonded to the external ends 22. A semiconductor device 28 is bonded, by die attach 30, to the central portion 16 of the base 14. Small bond wires 32, or optionally, thin strips of copper foil as utilized in tape automated bonding, electrically interconnect the semiconductor device 28 to the inner ends 24 of the circuit traces 20.

The standoff 12, extends across the central portion 16, forming a cover to encapsulate the semiconductor device 28, bond wires 32 and inner ends 24 of the circuit traces 20. The standoff 12 is bonded to the base 14 by a bonding agent 34 that is any suitable polymer, solder or sealing glass. Preferably, the bonding agent 34 is a thermosetting adhesive such as an epoxy.

The combined height of the bonding agent 34 and the standoff 12 relative to the base 14 is less than the diameter "D" of the solder balls 26. Preferably, the difference between the combined height and the diameter is between 0.005 inch and 0.030 inch, and most preferably, the difference is between 0.020 inch and 0.025 inch. As a result, on bonding the solder balls 26 to an electrically conductive array 36 formed on an external structure, such as a printed circuit board 38, the solder joints formed by the melting and re-solidification of the solder balls 26 are defined by the combined height of the bonding agent 34 and standoff 12.

The package base 14 is typically formed from a metal or a metal alloy such as copper, copper alloys, aluminum and aluminum alloys. The metallic base 14 is coated with a dielectric layer 40 that electrically isolates the circuit traces 20 from the metallic base 14. When the base 14 is aluminum or an aluminum alloy, the dielectric layer 40 may be an anodic film having a thickness between 0.0005 and 0.001 inch.

During operation, the semiconductor device 28 generates heat. Efficient operation of the semiconductor device 28 requires that this heat be dissipated to avoid excessively raising the temperature of the semiconductor device. The heat readily flows into the metallic base 14 and, by providing a direct thermal link between the standoff 12 and the printed circuit board 38, efficient dissipation of heat is achieved. This direct thermal link is formed by bonding the standoff 12 to the printed circuit board 38 through a cover solder 42. The cover solder 42 is any material that efficiently conducts heat and bonds to both the standoff 12 and to a bonding pad 44 formed on the printed circuit board. Preferably, the cover bonding agent 42 is a low-melting solder such as a lead/tin alloy. To enhance bonding of the cover solder 42 to the standoff 12, a first major surface 46 of the standoff 12 is coated with a solderable layer 48.

One suitable solderable layer 48 is a nickel coating having a thickness between 1 micron and 10 microns. Other suitable materials for the solderable layer 48 include gold, palladium, copper, tin and alloys thereof.

By bonding the standoff to the external structure 38, the joint reliability of the inner row of solder joints is improved. This is because flexing of the package in a vertical direction is reduced. Soldering is preferred over other methods of attachment, such as a thermosetting adhesive, because soldering is an inherently reworkable process and soldering is readily adaptable to convection, vapor phase and infrared heating that is typically used in electronic package assembly.

Running generally parallel to the first major surface 46 of the standoff 12 is a second major surface 50. The first major surface 46 and second major surface 50 are joined together by sidewalls 52. If the standoff 12 is formed from a metal or a metal alloy, such as copper, aluminum or an alloy thereof, it is preferable for at least a central portion of the second major surface 50 to be coated with an electrically insulating layer 54. The electrically insulating layer 54 prevents electrical short circuits in the event that a bond wire 32 contacts the standoff 12 and facilitates a lower package profile by not requiring a significant gap between the apex of the bond wires 32 and the second major surface 50 of the standoff 12.

The electrically insulating layer 54 may be an anodic film when the standoff 12 is aluminum or an aluminum alloy. Alternatively, the electrically insulating layer 54 is a thin, on the order of 0.0001 inch to 0.002 inch polymer coating. Suitable polymer coatings include epoxies, thermoplastics and polyimides. These polymeric coatings are preferred because they also enhance the adhesion of the bonding agent 34 to the standoff 12 and prevent corrosion. Additionally, when the electrically insulating layer 54 is a polymeric coating that extends under the bonding agent 34, the coating functions as a stress buffer to compensate for coefficient of thermal expansion differences between the standoff 12 and the base 14 of the ball grid array package 10.

Alternative standoffs are illustrated in FIGS. 2 through 10. In the embodiment illustrated in cross-sectional representation in FIG. 2 and top planar view in FIG. 3, the standoff 12 has a central portion 56 and a parallel running peripheral flange 58 that, while generally parallel with, is non-planar with the central portion 56. The combination of the central portion 56 and flange 58 defines a central cavity 60 underlying the second major surface 50 of the central portion 56. A plurality of apertures 62 extend through the flange 58.

Figure 3:
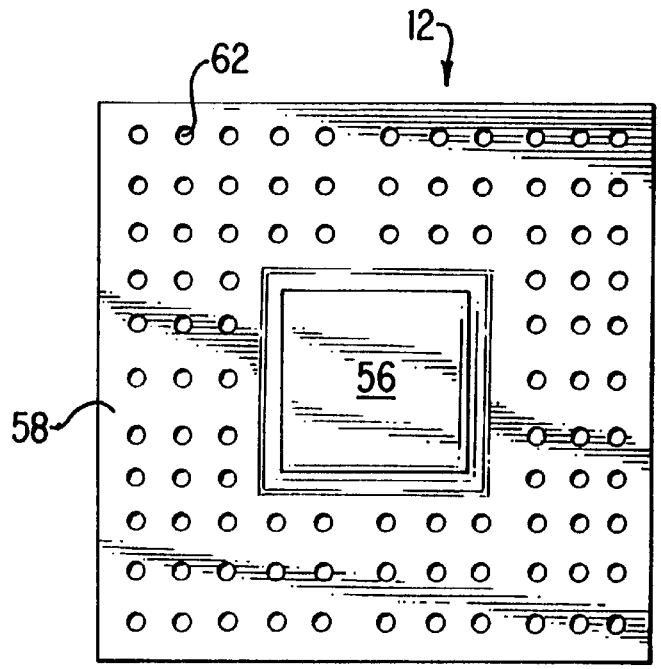
FIG. 3 illustrates in top planar view the standoff of FIG. 2.

As illustrated in FIG. 3, the apertures preferably form a uniform array of holes through the flange 58, circumscribing the central portion 56. While the height of the central portion 56 relative to a package base defines the standoff height, the apertures 62 are useful for improving the adhesion of the standoff 12 to a package substrate. A bonding agent flows into the apertures 62 during cure, forming a mechanical lock that increases the strength of the adhesive bond.

The apertures 62 enable the use of photocurable adhesives that facilitate attachment of the standoff 12 to a package substrate without heat. An underlying adhesive is irradiated with a suitable energy source such as infrared light or ultraviolet light through the apertures 62. One exemplary adhesive is a UV-curable epoxy.

As illustrated in FIGS. 4 and 5, the standoff height may be defined by dimples 64 or ridges 65 that protrude from the central portion 56 in a direction outward from the flange 58. The dimples preferably have a height of from 0.005 inch to 0.010 inch above the central portion 56.

The advantage of this embodiment is illustrated in FIG. 6. Circuitry 66 formed on the printed circuit board 38 can travel under the standoff 12 in the space defined by the dimples 64 or ridges. By minimizing the contact area with the printed circuit board 38, greater space is available for the routing of circuitry 66.

Figure 7:
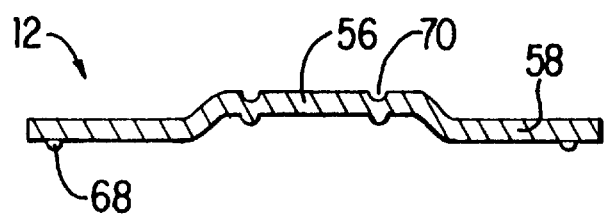
FIG. 7 shows in cross-sectional representation a standoff in accordance with another embodiment of the invention.
Figure 8:
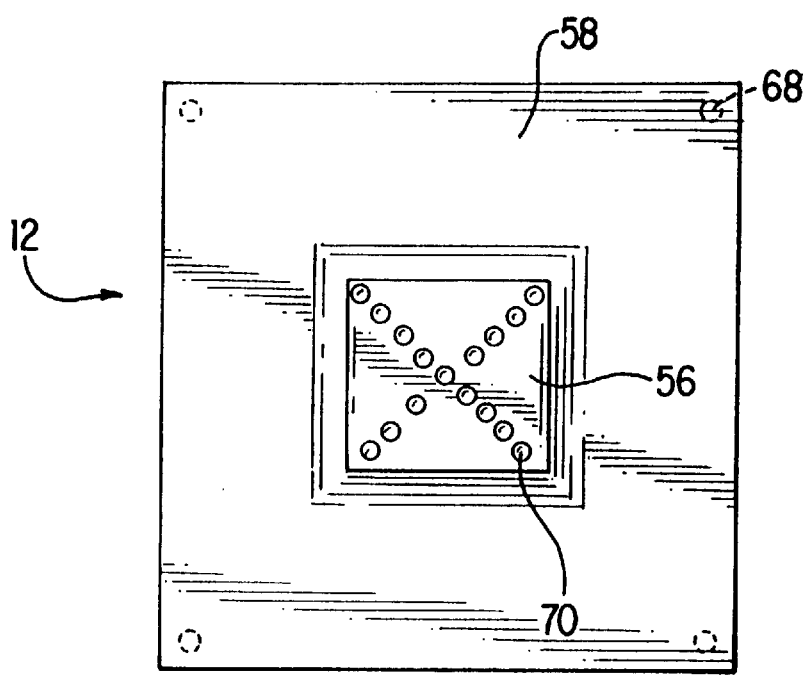
FIG. 8 illustrates in top planar view the standoff of FIG. 7.

With reference to FIGS. 7 and 8, the standoff 12 may include alignment features 68 such as dimples that mate with holes or other features in the package base. The dimples preferably have a height of from 0.005 inch to 0.010 inch above the surface of the flange 58.

Alternatively, ribs or a pattern of reinforcing dimples 70 may be provided in noncritical portions of the standoff, such as along a diagonal or disposed about the center of the standoff to increase the stiffness of the central portion 56.

In all embodiments, the flange 58 may have a width effective to provide a longer seal path to prevent moisture or contamination ingress. The larger width flange also provides greater mechanical strength adhesion between the standoff and the bonding adhesive. Typically, the flange 58 width is equal to or greater than 0.040 inch. Preferably, the flange 58 extends to the perimeter of the package base.

Figure 9:
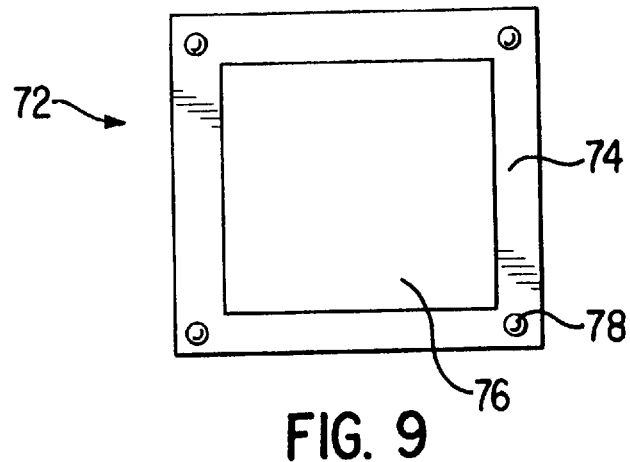
FIG. 9 illustrates in top planar view a standoff in accordance with another embodiment of the invention.

Rather than encasing the central portion of an electronic package base, the standoff may circumscribe this portion as illustrated in FIG. 9. In FIG. 9, the standoff 72 is a frame having a first side 74 and an opposing second side. The frame circumscribes a central aperture 76 and contains a plurality of extensions 78 protruding from the first surface 74. These protrusions typically extend for a height of from 0.005 inch to 0.010 inch above the first surface 74. The use of the standoff 72 is illustrated in FIG. 10.

Figure 10:
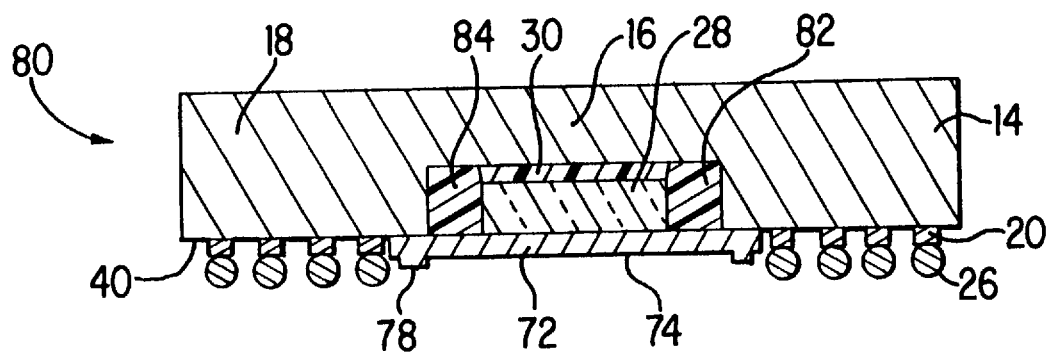
FIG. 10 illustrates in cross-sectional representation a ball grid array electronic package utilizing the standoff of FIG. 9.

In FIG. 10, the ball grid array electronic package 80 has many features similar to those described in the ball grid array package of FIG. 1. These common components are identified by like reference numerals and not fully described herein.

The package base 14 contains circuit traces 20 formed on a peripheral portion 18 thereof. In the event that the base 14 is formed from an electrically conductive material, a dielectric layer 40 coats at least those surfaces of the base 14 underlying the circuit traces 20. Solder balls 26 are bonded to external ends of the circuit traces 20.

A semiconductor device 28 is bonded to a central portion 16 of the base 14 through die attach 30. The central portion is recessed to form a cavity 82. A portion of this cavity is occupied by the semiconductor device 28 and die attach 30.

The standoff 72 is adhesively bonded to the base 14 to circumscribe the cavity 82. That portion of the cavity 82 not occupied by the semiconductor device 28 or die attach 30, as well as the central aperture 76 of the standoff are filled with a polymer resin 84. One suitable polymer resin is a thermosetting epoxy adhesive. The resin generally fills the cavity 82 and central aperture 76 up to the first surface 74 of the standoff 72.

When the solder balls become molten, the extensions 78 define the height of the solder columns.

While the invention has been described in terms of ball grid array electronic packages, it is equally applicable to other types of surface mount packages such as leadless chip carriers.

It is apparent that there has been provided in accordance with this invention a standoff for a surface mount electronic package that fully satisfies the objects, features and advantages set forth hereinabove. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. A ball grid array electronic package, comprising:

a base having a central portion and a peripheral portion;

a plurality of circuit traces formed on the peripheral portion of said base, each of said circuit traces having an inner end adjacent the central portion of said base and an external end forming a point on an array formed on said peripheral portion of said base;

solder balls having a diameter bonded to points of said array;

a semiconductor device bonded to said central portion and electrically interconnected to said inner ends of said circuit traces; and a standoff joined to said base by a first adhesive, said standoff having a first major surface that is generally parallel running to a second major surface and sidewalls extending from said first major surface to said second major surface, the combined height of said first adhesive and said standoff being less than the diameter of said solder balls.

2. The ball grid array electronic package of claim 1 wherein a central portion of said first major surface is coated with a solderable layer.

3. The ball grid array electronic package of claim 2 wherein said solderable layer is selected from the group consisting of nickel, gold, palladium, copper, tin, and alloys thereof.

4. The ball grid array electronic package of claim 3 wherein a central portion of said second major surface is coated with electrically insulating layer.

5. The ball grid array electronic package of claim 4 wherein said electrically insulating layer is selected from the group consisting of anodic films, thermoplastics, polyimides and epoxy.

6. The ball grid array electronic package of claim 1 wherein a central portion of said second major surface is coated with electrically insulating layer.

7. The ball grid array electronic package of claim 6 wherein said electrically insulating layer is selected from the group consisting of anodic films, thermoplastics, polyimides and epoxy.

8. The ball grid array electronic package of claim 1 wherein said standoff has a centrally disposed central portion and a peripheral flange with said flange having a width effective to prevent moisture ingress and to provide greater mechanical strength adhesion to a bonding agent.

9. The ball grid array electronic package of claim 1 wherein said standoff has a centrally disposed central portion and a peripheral flange with said flange having a plurality of apertures.

10. The ball grid array electronic package of claim 1 wherein said standoff has a centrally disposed central portion and a peripheral flange with protrusions extending outwardly from at least one of said flange and said central portion.

11. A ball grid array electronic package, comprising:

a base having a central portion and a peripheral portion;

a plurality of circuit traces formed on the peripheral portion of said base, each of said circuit traces having an inner end adjacent the central portion of said base and an external end forming a point on an array formed on said peripheral portion of said base;

solder balls having a diameter bonded to points of said array;

a semiconductor device bonded to said central portion and electrically interconnected to said inner ends of said circuit traces; and a standoff having first and second opposing sides with a height less than the diameter of said solder balls having said second side bonded to said base circumscribing a perimeter of said central portion thereof.

12. The ball grid array electronic package of claim 11 wherein said first side of said standoff has protrusions extending therefrom.

13. The ball grid array electronic package of claim 12 wherein a polymer resin fills said central portion of said base and said standoff up to said first side.

14. A cover for an electronic package, comprising:

a substrate having a central portion and a parallel running, non-planar peripheral flange; and said flange containing a plurality of apertures extending therethrough, said apertures uniformly arrayed and circumscribing said central portion.

15. The cover of claim 14 wherein said flange has a width effective to prevent moisture ingress and to provide greater mechanical strength adhesion to a bonding agent.

16. A cover for an electronic package, comprising:

a substrate having a central portion and a parallel running, non-planar peripheral flange; and a plurality of dimples protruding from said central portion.

17. The cover of claim 16 wherein said dimples have a height of from 0.005 inch to 0.010 inch above said central portion.

18. The cover of claim 17 wherein said flange has a width effective to prevent moisture ingress and to provide greater mechanical strength adhesion to a bonding agent.

19. The cover of claim 17 wherein said dimples extend diagonally across said central portion.

20. A cover for an electronic package, comprising:

a substrate having a central portion and a parallel running, non-planar peripheral flange; and a plurality of extensions protruding outward from said flange in a direction away from said central portion.

21. The cover of claim 20 wherein said extensions protrude for from 0.005 inch to 0.010 inch above said flange.

22. The cover of claim 21 wherein said flange has a, width effective to prevent moisture ingress and to provide greater mechanical strength adhesion to a bonding agent.

23. A cover for an electronic package, comprising:

a substrate having a central portion and a parallel running, non-planar peripheral flange; and a plurality of ridges protruding from said central portion.

24. The cover of claim 23 wherein said ridges have a height of from 0.005 inch to 0.010 inch above said central portion.

25. The cover of claim 24 wherein said flange has a width effective to prevent moisture ingress and to provide greater mechanical strength adhesion to a bonding agent.

26. The cover of claim 24 wherein said ridges extend diagonally across said central portion.

* * * * *